United States Patent [19]
Martin

[11] 3,956,821
[45] May 18, 1976

[54] METHOD OF ATTACHING SEMICONDUCTOR DIE TO PACKAGE SUBSTRATES

[75] Inventor: Mendell R. Martin, Scarborough, Maine

[73] Assignee: Fairchild Camera and Instrument Corporation, Mountain View, Calif.

[22] Filed: Apr. 28, 1975

[21] Appl. No.: 572,820

[52] U.S. Cl. .............................. 29/590; 29/576 S; 228/110; 228/123; 228/180 A; 228/263
[51] Int. Cl.² .................................... B01J 17/00
[58] Field of Search .............. 29/589, 590, 576 S; 228/110, 123, 180, 263

[56] References Cited
UNITED STATES PATENTS

| | | |
|---|---|---|
| 3,544,857 | 12/1970 | Byrne .............................. 29/576 S |
| 3,698,075 | 10/1972 | Boyle ................................ 228/110 |
| 3,844,029 | 10/1974 | Dibugnara ........................... 29/589 |
| 3,883,946 | 5/1975 | Dale ................................... 29/589 |
| 3,922,775 | 12/1975 | Potter ............................... 228/123 |

Primary Examiner—W. Tupman
Attorney, Agent, or Firm—Alan H. MacPherson; Henry K. Woodward; J. Ronald Richbourg

[57] ABSTRACT

A method of attaching semiconductor die to package substrates, which employs a zinc-aluminum alloy. The alloy is formed into the shape of a platelet. The platelet is melted on the die attach surface of a package substrate, and the semiconductor die is bonded to the substrate by cooling to solidify the alloy.

4 Claims, 5 Drawing Figures

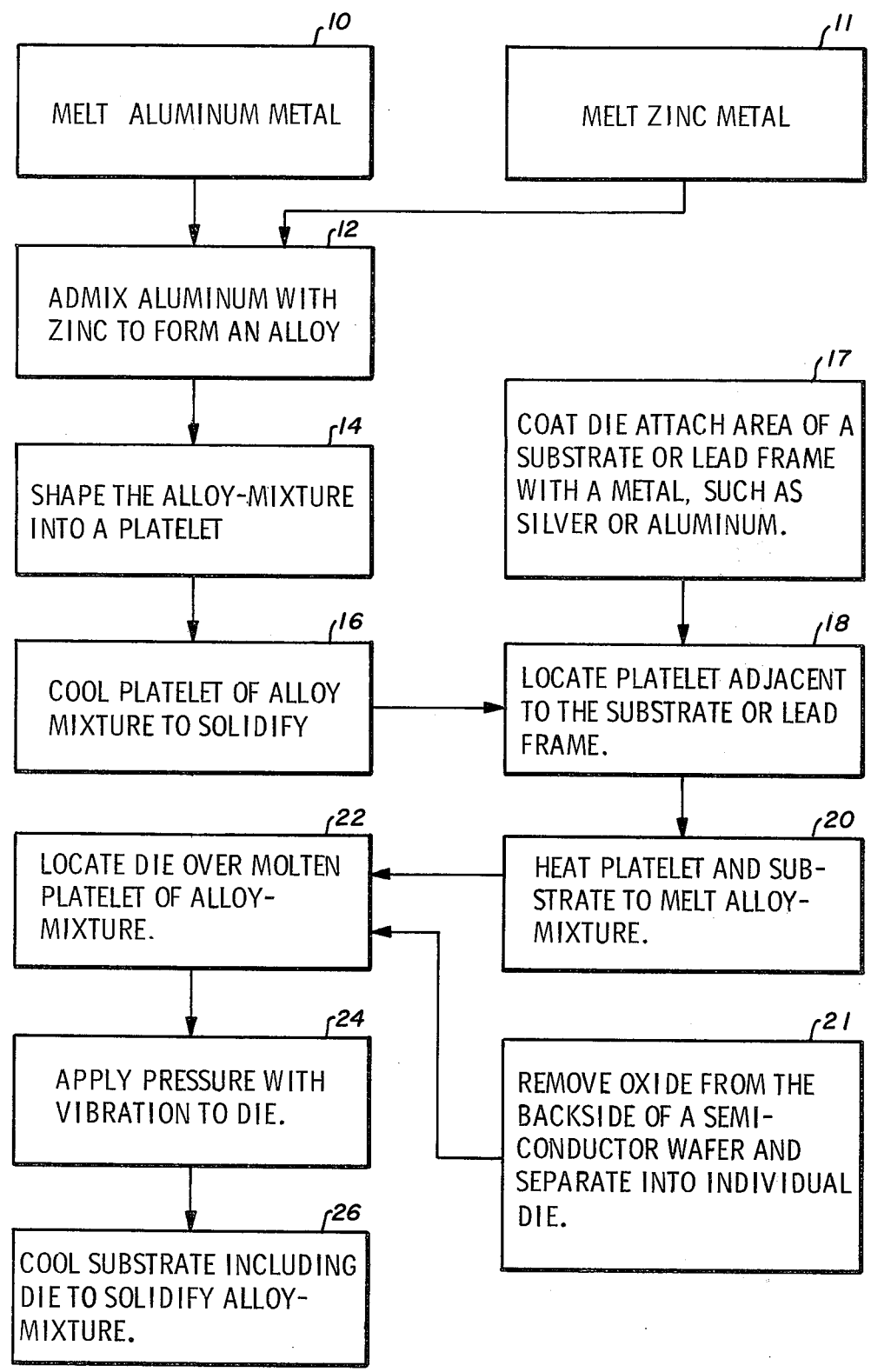
Fig_1

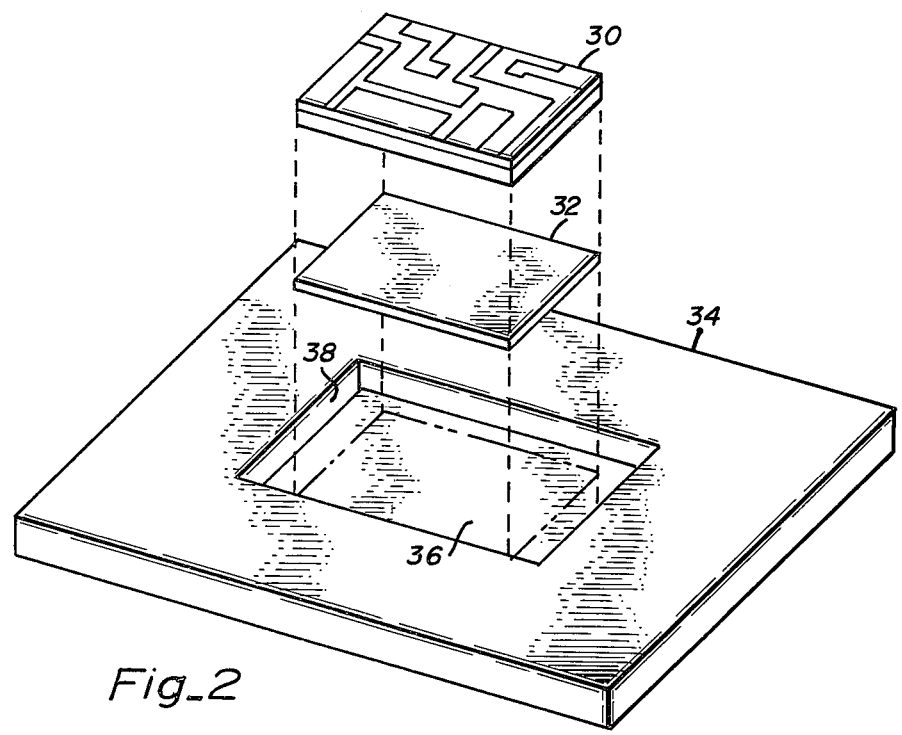
Fig_2
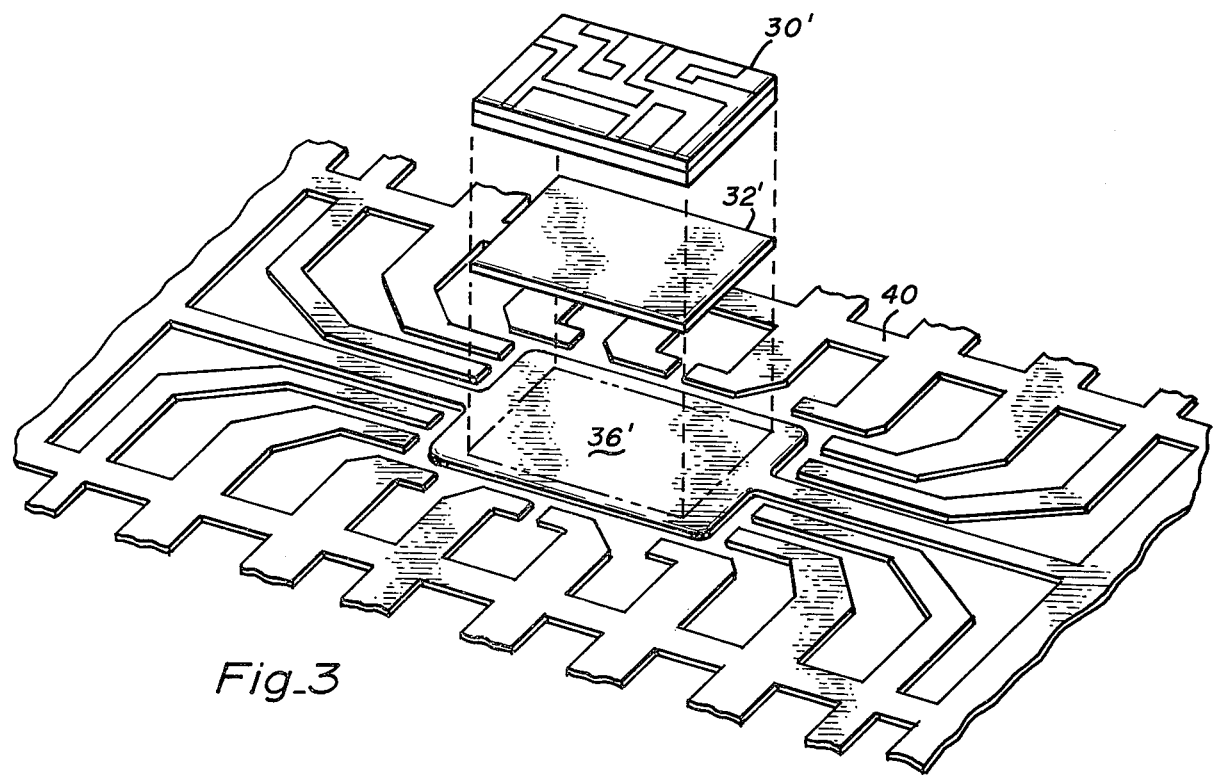
Fig_3

METHOD OF ATTACHING SEMICONDUCTOR DIE TO PACKAGE SUBSTRATES

FIELD OF THE INVENTION

This invention relates generally to the field of semiconductor die attach, and particularly to an improved method for die attach and an alloy composition therefor.

PRIOR ART

In the past, semiconductor die have been attached to a package substrate or lead-frame by means of forming a bond from a gold-silicon eutectic. Gold is coated into the backside of a semiconductor wafer and onto the area upon which the die is to be attached. Heat and pressure are applied to the semiconductor die and the substrate (area upon which the die is to be attached), and a fusion of the gold and silicon form a bond, thereby attaching the die to the substrate. This prior art technique is expensive due to the high cost of gold.

Other techniques of semiconductor die attach have been employed in the past. For example, an epoxy composition or a low-temperature glass composition has been used. The disadvantage of using these prior art die attach techniques contribute to a sacrifice in electrical and thermal dissipation properties of the die attach composition.

SUMMARY OF THE INVENTION

The method and composition of the present invention overcome the disadvantages of the prior art die-attach methods and compositions described above by employing an alloy comprising zinc (Zn) and aluminum (Al) of a predetermined ratio therebetween.

In accordance with this invention, a method of attaching semiconductor die to a package substrate is provided, which method comprises melting an aluminum metal; melting a zinc metal; admixing 5% to 30% by weight of the molten aluminum metal with 95% to 70%, respectively, of the molten zinc metal, to thereby form an aluminum-zinc alloy; shaping the alloy mixture into a platelet, cooling the alloy mixture to a solid state; locating the platelet adjacent to the package substrate; heating the package substrate including the platelet to a temperature within the range of 400 to 440°C, wherein the platelet of the alloy mixture becomes fluidic; locating the semiconductor die adjacent to the fluidic platelet on the substrate; simultaneously applying pressure with vibration to the semiconductor die; and, cooling the package substrate including the semiconductor die and the fluidic mixture of the alloy to thereby solidify the alloy mixture and attach the semiconductor die to the package substrate.

An advantage of the present invention is a simple and economic method for attaching semiconductor die to package substrates.

Another advantage of the present invention is a method of attaching semiconductor die to package substrates more economical than prior art methods, which method employs an alloy composition having substantially the same electrical and theremal properties as that of the prior art die attach alloys.

BRIEF DESCRIPTION OF THE DRAWINGS

FIG. 1 is a flow chart illustrating the method of the present invention;

FIG. 2 is an isometric drawing illustrating the location of the platelet and semiconductor die adjacent to a package substrate;

FIG. 3 is an isometric drawing illustrating the location of the platelet and the semiconductor die adjacent ot a lead frame;

DETAILED DESCRIPTION

Figure 4:
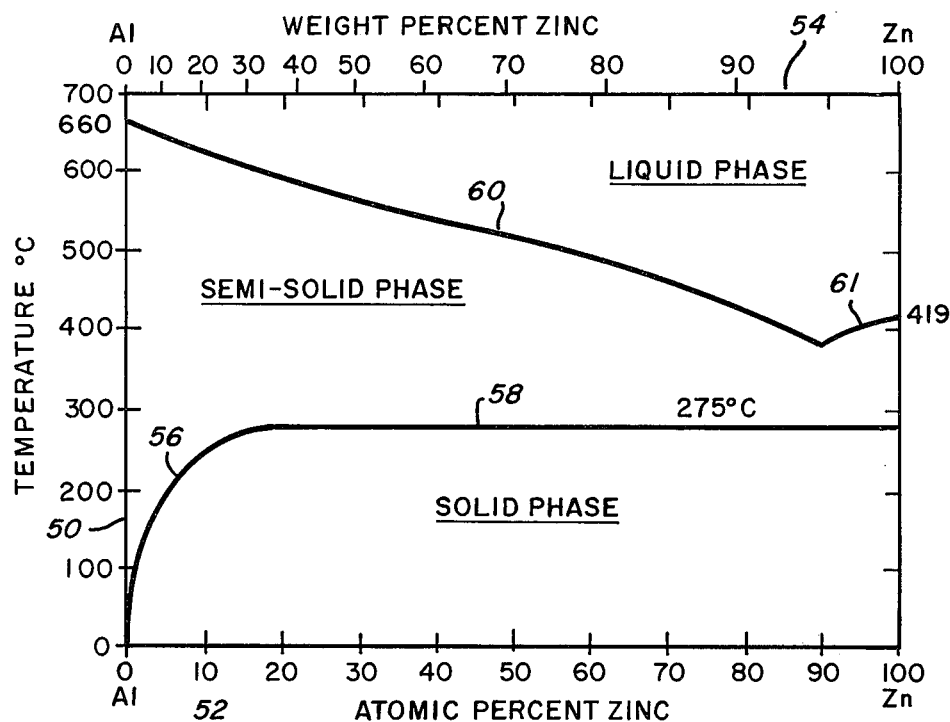
FIG. 4 is an aluminum-zinc phase diagram.

Referring now to FIG. 1, a block diagram of the method of the present invention is illustrated. Block 10 represents the melting of an aluminum metal, and block 11 represents the melting of a zinc metal. The molten aluminum is admixed with the molten zinc, as represented by block 12, to thereby form an aluminum-zinc alloy. The ratio of the zinc to aluminum in the composition of this invention can be varied from 70% by weight of zinc to 30% by weight of aluminum up to a ratio of 95% by weight of zinc and 5% by weight of aluminum. However, from experimentation, it has been found that a preferred composition comprises 95% by weight of zinc and 5% by weight of aluminum. Concentrations of zinc in excess of 95% were found to be unsuitable. The zinc and aluminum can be admixed in a powder form prior to the application of heat for melting. However, the zinc and aluminum are preferrably melted from solid metallic forms and then combined into an alloy-mixture.

The step represented by block 10 is performed by applying heat at a temperature of approximately 660°C to melt the aluminum, and heat is applied to the zinc metal (block 11) at a temperature of approximately 420°C to melt the zinc. Once the aluminum and zinc metals reach a fluidic state, they are mixed together (block 12), and then shaped into a platelet as represented by block 16, to thereby return the alloy mixture to a solid state. Once the platelet has been formed by the method as described above, the platelet is then used as a means for attaching semiconductor die to substrates. The platelets are generally shaped into a circular disk approximately 30 mils in diameter and at a thickness of 2 mils. This size platelet yields a volumn of 1413 cubic mils of the alloy-mixture, and is suitable for attaching to substrates or lead-frames semiconductor die having an attach surface area within the range of 1600 square mils to 3000 square mils.

The die attach area of a substrate package or a lead-frame is coated with a metal such as silver or aluminum, as represented by block 17. In accordance with one embodiment, aluminum is used and is evenly filled in the die attach area of the package substrate at a minimum thickness of 80 micro inches. The platelet is next located adjacent to the die attach area of the substrate or the lead-frame, as represented by block 18.

The substrate including the platelet is heated to a temperature within the range of 400 to 440°C for 5 to 30 seconds, as represented by block 20, to thereby melt the alloy-mixture. The melting temperature (eutectic) of the aluminum-zinc alloy mixture is lower than the melting temperature of aluminum (660°C) or the melting temperature of zinc (420°C). This will be explained in greater detail hereinblow in conjunction with the discussion accompanying the Al-Zn phase diagram shown in FIG. 4.

The preferred die attach temperature was found by experimentation to be within the above-defined range, and the result of this experimentation is as follows. A platelet having a composition ratio by weight of 95% Zn and 5% Al was used, with an 80 micro inch thick layer of Al coating on the die attach surface.

| TEMPERATURE | TIME | RESULTS |
| --- | --- | --- |
| 400°C | 5 sec | No bond |
| | 10 sec | No bond |
| | 30 sec | Bond |
| 425°C | 5 sec | Bond |
| | 10 sec | Bond |
| | 30 sec | Bond |
| 450°C | 5 sec | Bond |
| | 10 sec | Bond |
| | 30 sec | Bond |
| 500°C | 5 sec | Bond |
| | 10 sec | Bond |
| | 30 sec | Bond |

Any oxide on the backside of a semiconductor wafer containing a multiplicity of semiconductor die is removed, and the wafer is separated into individual die as represented by block 21. The semiconductor die is next located adjacent to the molten platelet within the package substrate or lead-frame, as represented by block 22. Pressure is applied to the semiconductor die with vibration, or a scrubbing motion, as represented by block 24. Next, the substrate including the die and the fluidic alloy mixture is cooled to solidify the alloy mixture and thereby bond the semiconductor die to the package substrate or lead-frame, as represented by block 26.

It is noted that Zn and Si do not form an alloy; accordingly, pure Zn would be an unsatisfactory die attach composition. A minimum amount of Al is required in the die attach composition of this invention to effect an Al-Si interaction for bonding. Solubilities of Al in Si at various temperatures are set forth at page 133 of "Constitution of Binary Alloys" by Dr. Max Hansen and published in the "Metallurgy and Metallurgical Engineering Series" by McGraw-Hill. Pertinent solubilities are as follows:

| Percent by weight of Al | Temperature |
| --- | --- |
| 0.48% | 450°C |
| 0.29% | 400°C |
| 0.17% | 350°C |

Consequently, a limited amount of Al penetrates into the Si of the semiconductor chip at temperatures within the above-defined die attach temperature range. This limited amount of penetration (solubility) of Al into the Si has proven to be sufficient for attaching semiconductor die to a package substrate. For example, semiconductor die attached with the method and composition of this invention were subjected up to 8 to 9 pounds of shear force before destruction of the die attach bond occurred.

Referring now to FIG. 2, an isometric view of a semiconductor die 30, a platelet 32, and a package substrate 34 are shown. The shape of the platelet 32 may be rectangular as shown, or it may be circular in shape as described above. The die attach surface 36, which is located on the bottom surface of a cavity 38 in the substrate 34, is filled with a layer of aluminum or silver. As stated hereinabove, aluminum is used in one embodiment and is filled evenly at a minimum thickness of 80 micro inches. However, silver may also be used to coat the die attach surface 36. The platelet 32 is next placed onto the surface 36. The substrate 34 containing the platelet 32 is heated to thereby melt the platelet of the alloy-mixture, and the semiconductor die 30 is placed adjacent to the molten platelet 32 with pressure and vibration, or a scrubbing motion, in the cavity 38.

The backside of the semiconductor die 33 is preferably oxide free to enable penetration of the aluminum of the zinc-aluminum alloy into the silicon of the die 30. However, excessive penetration of zinc or aluminum ions into the silicon may cause deleterious results to the operation of the semiconductor devices. That is, metallic ions in close proximity to the active regions of the semiconductor device will cause improper operation. From experimentation, it was found that when the die attach surface 36 was coated with aluminum, and the die attach temperature was in the above-defined range of 400 to 440°C, aluminum ions penetrated into the silicon of the semiconductor die to a depth of 2.5 microns, and the zinc ions penetrated into the silicon to a depth of 3 microns. However, when the die attach surface 36 was coated with silver, and the same die-attach temperatures were employed, the aluminum ions penetrated to a depth of 2.0 microns into the silicon of the semiconductor die 30, and the zinc ions penetrated to a depth of 3.5 microns. In order to limit the depth of penetration of the zinc ions into the semiconductor die, the die attach temperature should not exceed 440°C, and the time of application of the die attach heat at this temperature should not exceed 10 seconds.

Normally, semiconductor wafers having diameters within the range of 2 inches to 3 inches are 15 to 20 mils thick, respectively. Accordingly, the above-described depths of penetration of zinc and aluminum ions are 1/127 (worst case) of the total thickness of the wafer. Consequently, there is a de minimus danger of the ions having any deleterious effect on the operation of the semiconductor device.

The aluminum filler in the cavity 38 on the die attach surface 36 performs two functions. First, it enhances the penetration to a sufficient depth for die attaching of the aluminum of the aluminum-zinc alloy into the silicon of the semiconductor die 30. Secondly, the aluminum filler is the same as one of the materials in the aluminum-zinc alloy, which forms a bond in a shorter period of time.

It is also possible to employ the above-described die-attach method when attaching a semiconductor die to a lead-frame. Referring now to FIG. 3, an isometric view of a semiconductor die 30', a platelet 32' and a lead-frame 40 are shown. The die attach surface 36', which comprises a paddle within the lead-frame 40, is coated with a thin even layer of aluminum or silver. The techniques as described hereinabove are also applicable for attaching a semiconductor die 30' to a lead-frame paddle 36' with the exception that an aluminum coated paddle for a lead-frame is employed in lieu of the aluminum coated die attach surface 36 (FIG. 2).

Referring now to FIG. 4, a phase diagram of Al-Zn alloy is shown. The vertical axis 50 represents temperature in degrees centigrade, the lower horizontal axis 52 represents atomic percent zinc (wherein 100% Al corresponds to 0% zinc), and the upper horizontal axis 54 represents weight per cent zinc (wherein 100% Al also corresponds to 0% zinc). The area of the diagram below the curve 56 and line 58 (at 275°C) represents the solid phase of the Al-Zn alloy. The area between the curve 56 and line 58 and the curves 60 and 61 represents semi-solid phases of the Al-Zn alloy. The area above the curves 60 and 61 represent the liquid phase of the Al-Zn alloy.

Accordingly, it may be seen that an alloy containing 95 percent zinc and 5 percent aluminum is in the liquid state between 400° and 440°C, which is the preferred die attach temperature.

Figure 5:
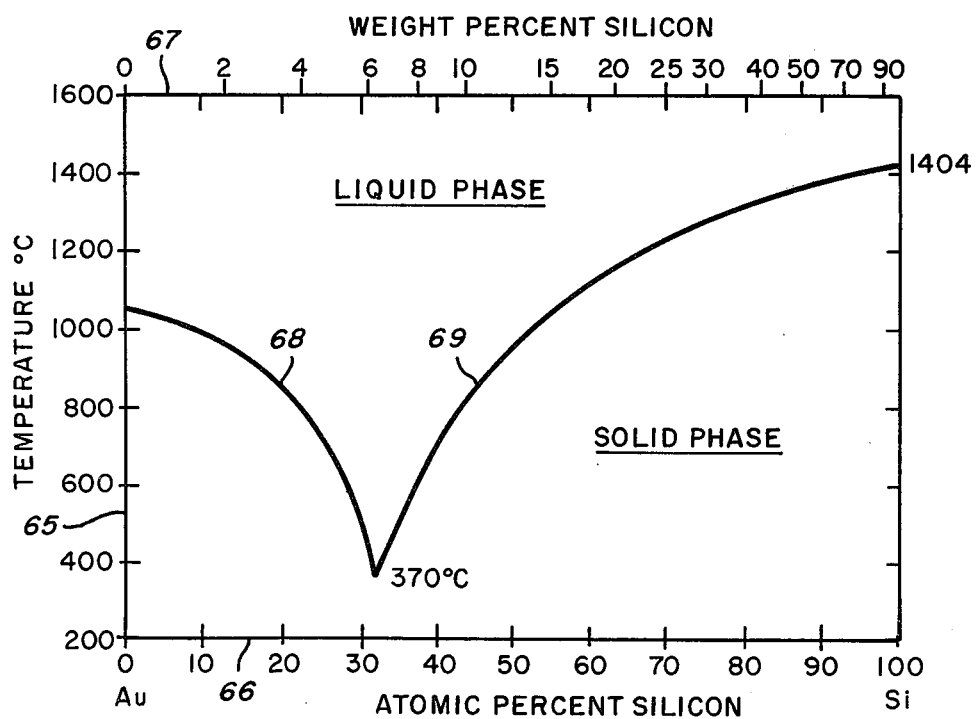
FIG. 5 is a gold silicon phase diagram.

A phase diagram of the prior art Au-Si semiconductor die attach alloy is shown in FIG. 5. The vertical axis 65 represents temperature in degrees centigrade, the lower horizontal axis 66 represents atomic percent silicon (wherein 100% Au corresponds to 0% Si), and the upper horizontal axis 67 represents weight percent silicon (wherein 100% Au also corresponds to 0% Si). The area of the diagram below curves 68 and 69 represents the solid phase of the Au-Si alloy, and the area above curves 68 and 69 represents the liquid phase of this alloy.

By comparing the phase diagrams shown in FIGS. 4 and 5, it may be seen that when gold and silicon are combined in a weight ratio of approximately 6 to 8 percent Si to 94 to 92 percent Au, melting points (die attach temperatures) of each alloy are comparable. Consequently, the Al-Zn die attach alloy has a melting point and a concomitant die attach temperature substantially the same as the prior art Au-Si die attach alloy, when each alloy is combined in the above-defined percentage ratios by weight.

I claim:
1. A method of attaching semiconductor die to a package substrate comprising:
    a. melting an aluminum metal;
    b. melting a zinc metal;
    c. admixing 5% to 30% by weight of said molten aluminum metal with 95% to 70%, respectively, of said molten zinc metal to thereby form an aluminum-zinc alloy;
    d. shaping said alloy mixture into a platelet;
    e. cooling said platelet of said alloy mixture;
    f. locating said platelet adjacent to the package substrate;
    g. heating the substrate including said platelet to a temperature within the range of 400° to 440°C, wherein said platelet of said alloy mixture becomes fluidic;
    h. locating the semiconductor die adjacent to said fluidic platelet on the package substrate;
    i. simultaneously applying pressure with vibration to the semiconductor die; and,
    j. cooling the package substrate including the semiconductor die and the fluidic mixture of said alloy to thereby solidify the alloy mixture and attach the semiconductor die to the package substrate.

2. A method as defined in claim 1 including the step of coating the die attach surface of the package substrate with aluminum prior to the step of locating said platelet adjacent to the package substrate.

3. A method as defined in claim 1 including the step of coating the die attach surface of the package substrate with silver prior to the step of locating said platelet adjacent to the package substrate.

4. A method as defined in claim 1 including the step of removing oxide from the backside surface of the semiconductor die prior to the step of locating the semiconductor die adjacent to said platelet on the package substrate.

* * * * *